United States Patent
Kohmoto et al.

(10) Patent No.: US 6,900,512 B2
(45) Date of Patent: May 31, 2005

(54) LIGHT-RECEIVING MODULE

(75) Inventors: Kenichiro Kohmoto, Yokohama (JP);
Takeshi Sekiguchi, Yokohama (JP);
Motoyoshi Tanaka, Yokohama (JP);
Makoto Ito, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 19 days.

(21) Appl. No.: 10/373,186

(22) Filed: Feb. 26, 2003

(65) Prior Publication Data

US 2003/0183894 A1 Oct. 2, 2003

(30) Foreign Application Priority Data

Feb. 27, 2002 (JP) ........................................ 2002-052015

(51) Int. Cl.[7] .................. H01L 31/0232; H01L 31/0203
(52) U.S. Cl. ........................ 257/435; 257/432; 257/433; 257/434; 257/436; 257/692; 257/698; 257/775; 257/438; 250/214.1; 250/214 R
(58) Field of Search ................................ 257/432–436, 257/692, 698, 775, 438; 250/214.1–214 R

(56) References Cited

U.S. PATENT DOCUMENTS 5,814,871 A * 9/1998 Furukawa et al. .......... 257/433
5,841,565 A * 11/1998 Kanai ......................... 398/202
6,670,600 B2 * 12/2003 Terano et al. ............ 250/214.1

* cited by examiner

Primary Examiner—Jerome Jackson
Assistant Examiner—Joseph Nguyen
(74) Attorney, Agent, or Firm—McDermott Will & Emery LLP

(57) ABSTRACT

This invention relates to a light-receiving module in which transmission impedance of lead terminals are matched by simple method. The module has a semiconductor light-receiving device, such as a photo diode, a plurality of lead terminals for transmitting an electrical signal converted by the semiconductor device, and a metal base with a plurality of through holes, the lead terminals passes therethrough. The diameter of the lead terminal for signal transmission is smaller as compared with that of other lead terminal and the diameter of the through holes is adjusted and filled by a sealant glass with a dielectric constant so as to match the impedance thereof.

4 Claims, 10 Drawing Sheets

Prior Art

LIGHT-RECEIVING MODULE

BACKGROUND OF THE INVENTION

1. Field of the Invention

This invention relates to a light-receiving module, in which an optical signal is converted into an electrical signal.

2. Related Prior Art

As shown in FIG. 9 and FIG. 10, a conventional light-receiving module has a semiconductor light-receiving device 102, such as a photodiode, a base 103 for mounting the light-receiving device 102, and a plurality of lead terminals 104 to 108. The semiconductor light-receiving device converts an incident optical signal to a corresponding electrical signal. The base 102 also mounts a semiconductor electronic device that amplifies the converted electrical signal and outputs the signal to an outside of the module through the lead terminal. A sealing material 109, such as a glass sealant, supports the lead terminals 104 to 108 that are not connecting to the base 103. The sealing material electrically isolates the lead terminals 104 to 108 from the base 102. In the conventional module, the base made of metal forms a hollow 110 in its backside opposing to the surface where the semiconductor device is mounted thereon. The sealing material is entirely filled up within the hollow.

The current optical communication requires a transmission speed over 10 Gbps. In such high-speed application, the conventional optical module shown in FIGS. 9 and 10 can not be applicable because a lead terminal through which an electrical signal is transmitted has not an impedance-matched configuration. When the electrical signal transmits such lead terminal, a reflection and a loss of the signal may occur at an impedance-mismatched portion. The higher the transmission speeds, the more serious this impedance-mismatched problem. Moreover, the higher the transmission speeds, the more the power consumption of the semiconductor device. In the conventional module, since the backside of the base is entirely filled up with the sealant that has less thermal conductivity than metal, the heat dissipation through the base is restricted.

SUMMARY OF THE INVENTION

An object of the present invention is to provide an optical module having the impedance-matched lead terminals with simple configuration. In order to solve an impedance-mismatching and a less heat dissipation, according to one aspect of the present invention, an optical module having a semiconductor light-receiving device, such as a photo diode, comprises a first lead terminal, a second lead terminal and a metal base for mounting the semiconductor device. The first lead terminal transmits the electrical signal converted by the semiconductor device, while the second lead terminal supplies an electrical power to the semiconductor device. The first and the second lead terminal pass respective through holes on the base. A sealant for sealing the semiconductor device from the environment fills up only openings between the respective inner surfaces of the through holes and the respective lead terminals.

According to the present module, the diameter of the first lead terminal is smaller as compared with that of the second lead terminal so as to match the impedance at the through hole by filling the through hole with the sealant having a dielectric constant. This impedance-matched configuration enables to transmit an electrical signal over 10 GHz therethrough. Moreover, since the principal portion of the base except for the through holes is made of metal, the heat dissipation from the semiconductor device mounted on the base can be enhanced through the metal base.

A cylindrical member made of electrically conductive material is preferably mounted on the base so as to surround the first lead terminal. In this configuration, a tip portion of the first lead terminal protruding from the base can easily adjust the impedance-matched condition thereof.

Moreover, a diameter of the tip portion of the first lead terminal is preferably greater as compared with the other portion. This configuration enables it easier to bond the conductive wire thereon when the diameter of the first lead terminal is small so as to match the impedance at the through hole.

Another aspect of the present invention is an optical assembly comprising an optical module and a circuit board installed the optical module thereon. The optical module includes a semiconductor light-receiving device, a first and a second lead terminals and a metal base. The circuit board has a signal transmission pattern on a first surface and power supply lines on a second surface. The first lead terminal outputs an electrical signal corresponding to an optical signal, and the second lead terminal provides an electrical power to the semiconductor device within the module. The metal base has a plurality of through holes, the first and the second lead terminal pass theretrough. The first lead terminal is impedance-matched at the through hole by adjusting the diameter thereof, the diameter of the through hole, and the dielectric constant of the sealant filling up the through hole. The circuit board is sandwiched by the first lead terminal and the second lead terminal. The first lead terminal is connected to the transmission line of the first surface such that the terminal is straitened, while the second lead terminal is connected to the power supply lines on the second surface.

In this assembly, the electrical signal converted by the semiconductor device is transmitted to the first lead terminal, the impedance of which is matched at the portion of the through hole, and finally transferred to the transmission line on the first surface of the board. Since the base of the module abuts on or so close to the edge of the board and the first lead terminal is connected to the transmission line such that the terminal is straitened, the reflection and the loss of the signal can be restricted.

DETAILED DESCRIPTION OF THE INVENTION

Figure 1:
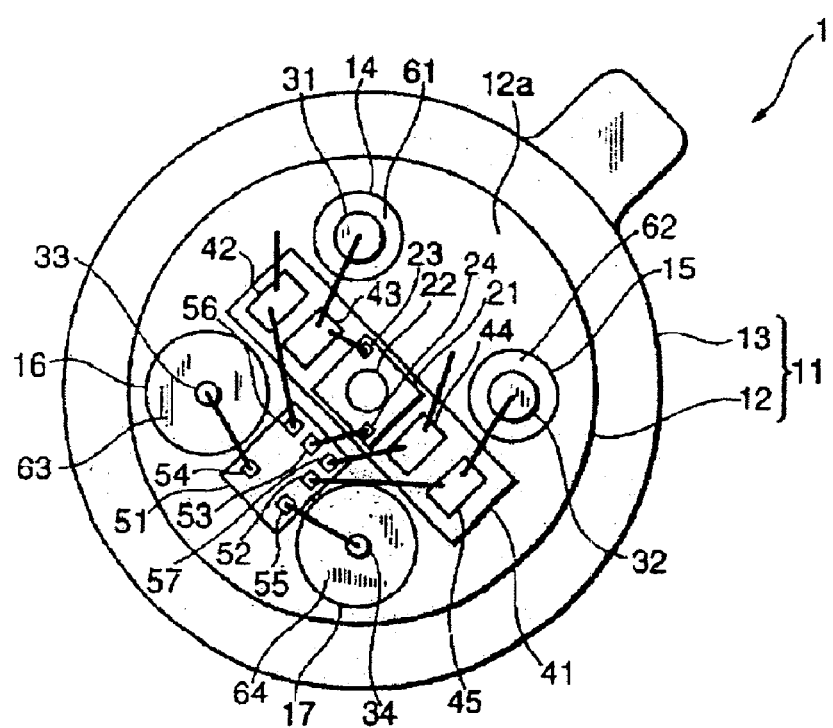
FIG. 1 is a plan view showing the first embodiment of the present invention.

The preferred embodiments of the present invention will be described. Elements identical to each other will be referred to with numerals identical to each other without overlapping explanations. In the drawings, dimensions such as the thickness and the diameter of the lead terminals will not always reflect their explanation.

(First Embodiment)

Figure 2:
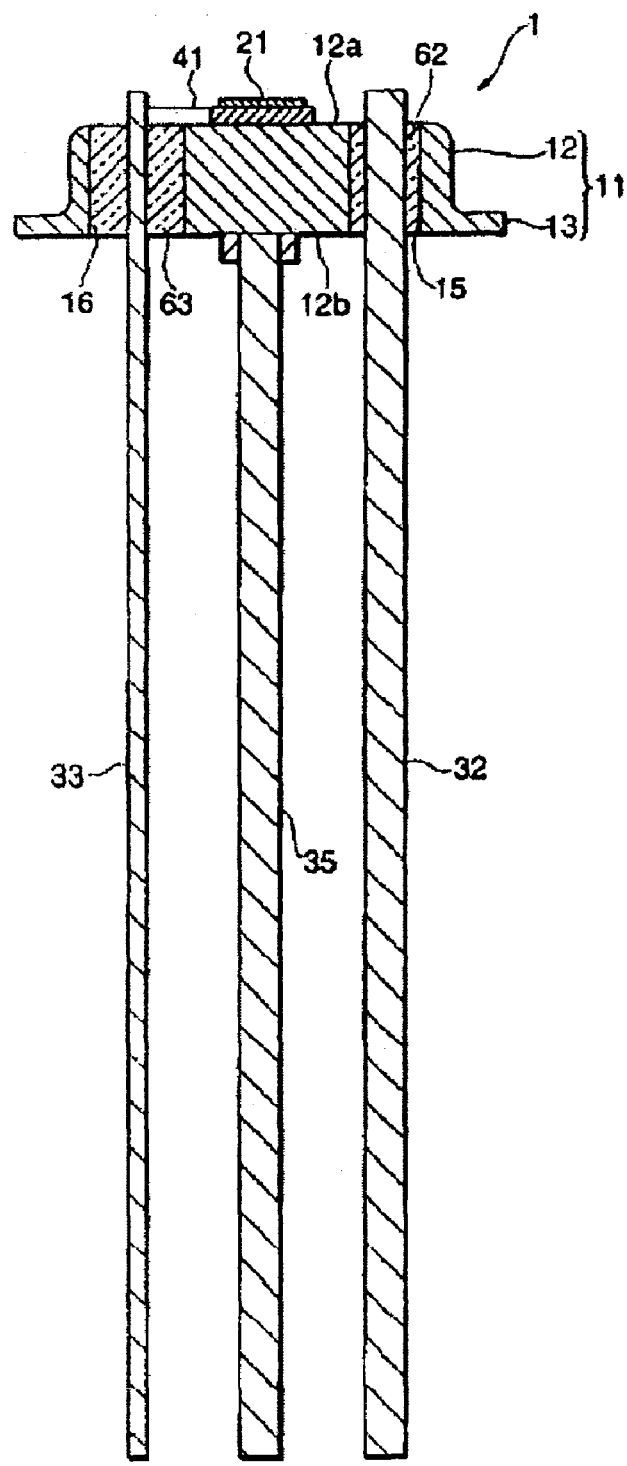
FIG. 2 is a cross-sectional view of the first embodiment.

FIG. 1 is a plan view and FIG. 2 is a cross-sectional view of an optical module according to the first embodiment of the present invention. The optical module shown in figures is used as a receiving optical sub-assembly (ROSA) of an optical transceiver. The module has a base 11, a semiconductor light-receiving device 21 and a plurality of lead terminals 31 to 35.

The base 11 comprises of a body 12 and a brim. The body 12 has a mount surface 12a, on which the semiconductor light-receiving device and a semiconductor electronic device are mounted, and an outer surface 12b opposite to the mount surface 12a. The base 11 is made of metal, such as Kovar or CuW, with the entire surface of which is plated with gold. A lens holder, not shown in the figures, is placed on the brim 13 so as to surround the body 12. A lens provided in the lens holder concentrates light emitted from a tip of an optical fiber to the semiconductor light-receiving device. The thickness of the base 11 is preferably from 1.1 mm to 1.5 mm, the diameter of the body 12 is about 4.2 mm, and that of the brim 13 is preferably 5.4 mm.

The mount surface 12a of the body 12 mounts a die capacitor 41 and a semiconductor electronic device 51 thereon. The semiconductor light-receiving device 21 is stacked on the die capacitor 41. The die capacitor has a plurality of pads 42 to 45. The pads 42, 44 are electrically grounded to the base 11 by bonding wires.

The light-receiving device 21 is preferably a photo diode, which has a light-sensing portion 22, a first electrode 23 and a second electrode 24 thereof. The first electrode 23 is connected to the pad 43 on the die capacitor 41 with a bonding wire to supply a bias voltage Vpd to the light-receiving device 21. The second electrode is provided for outputting a current signal obtained by converting an incident light thereto.

The semiconductor electrical device 51 is preferably an amplifier, such as a trans-impedance amplifier, which converts the current signal output from the light-receiving device into a voltage signal, and amplifies the voltage signal. The electrical device 51 provides a first, a second, a third, a fourth, and a plurality of grounded electrodes thereon.

The first electrode 52 is connected to the pad 45 on the die capacitor 41 to supply an electrical power Vcc to the device 51. The second electrode 53 is connected to the light-receiving device 21 to receive a current signal corresponding to the incident light. The third electrode 54 and the fourth electrode 55 output signals amplified by the electrical device 51 to outside the module. The phases of the signals, which are output from the respective electrodes 54, 55 are complementary to each other. The grounded electrodes 56, 57 are connected to the body 12 through the respective pads 42, 44 on the die capacitor 41.

The body 12 has a plurality of holes 14 to 17 boring from the mount surface 12a to the outer surface 12b. A plurality of lead terminals 31 to 34 is inserted in the corresponding holes 14 to 17. The diameter of two holes 14, 15 is about 0.8 mm, while that of other two holes 16, 17 is about 1.1 mm.

The lead terminals 31 to 34 are inserted into the holes 14 to 17 such that the tips of the respective terminals protrude from the mount surface 12a by a length, for example 0.35 mm, and electrically isolated from the base 11. The terminals 31 to 34 are fixed at nearly center of the holes. These lead terminals are divided into two groups. The first group has a diameter of about 0.45 mm and inserted into the relatively smaller holes 14, 15, while the other group has a diameter of about 0.2 mm and inserted into the relatively greater holes 16 and 17.

By filling a sealing material, such as glass sealant, into the openings of the holes 14 to 17, the lead terminals 31 to 34 are fixed to the base 11. The lead terminals are preferably made of Kovar. The dielectric constant of the sealing material is about 4.1.

The lead terminal 31 supplies a bias voltage Vpd to the light-receiving device 21. The lead terminal 31 and the first electrode 23 of the light-receiving device are electrically connected by a bonding wire from the terminal to the pad 43 on the die capacitor 41 and another bonding wire from the pad 43 to the first electrode 23.

The lead terminal 32 supplies another bias voltage Vcc to the semiconductor electronic device 51. A bonding wire from the terminal 32 to the pad 45 on the die capacitor 41 and another bonding wire from the pad 45 to the second electrode 52 electrically connect the terminal 32 to the electronic device 51 and supply the bias voltage Vcc thereto.

The lead terminal 33 is connected to the third electrode 54 of the device 51 and outputs a signal amplified thereby. While, the lead terminal 34 is connected to the fourth electrode 55 and outputs complementary signal to that from the third electrode 54.

The fifth lead terminal 35 is fixed and electrically connected to the outer surface 12b of the base 11. This lead terminal is also made of metal, such as Kovar, with a diameter of about 0.45 mm and has a function to ground the base 11.

The diameter of the second group of the holes 16, 17 and that of the second group of lead terminals 33, 34 are about 11 mm and about 0.2 mm, respectively. The space between the lead terminals and the holes are completely filled by the glass sealant with a dielectric constant of about 4.1. This configuration achieves the transmission impedance at the holes to be about 50 ohm, which matches to that of the transmission line. By setting the diameter of the lead terminal and that of the hole based on the dielectric constant of the sealing material, it can be controlled the impedance of the lead terminal at the hole.

Further, since the base 11 is entirely made of metal, the thermal resistance of the base 11 can be reduced as compared with the conventional module, in which most of the base is made of the sealing material except the mount surface. Therefore, heat generated in the semiconductor electronic device 51 can be easily dissipated through the base 11 to the outside of the module.

(Second Embodiment)

Figure 3:
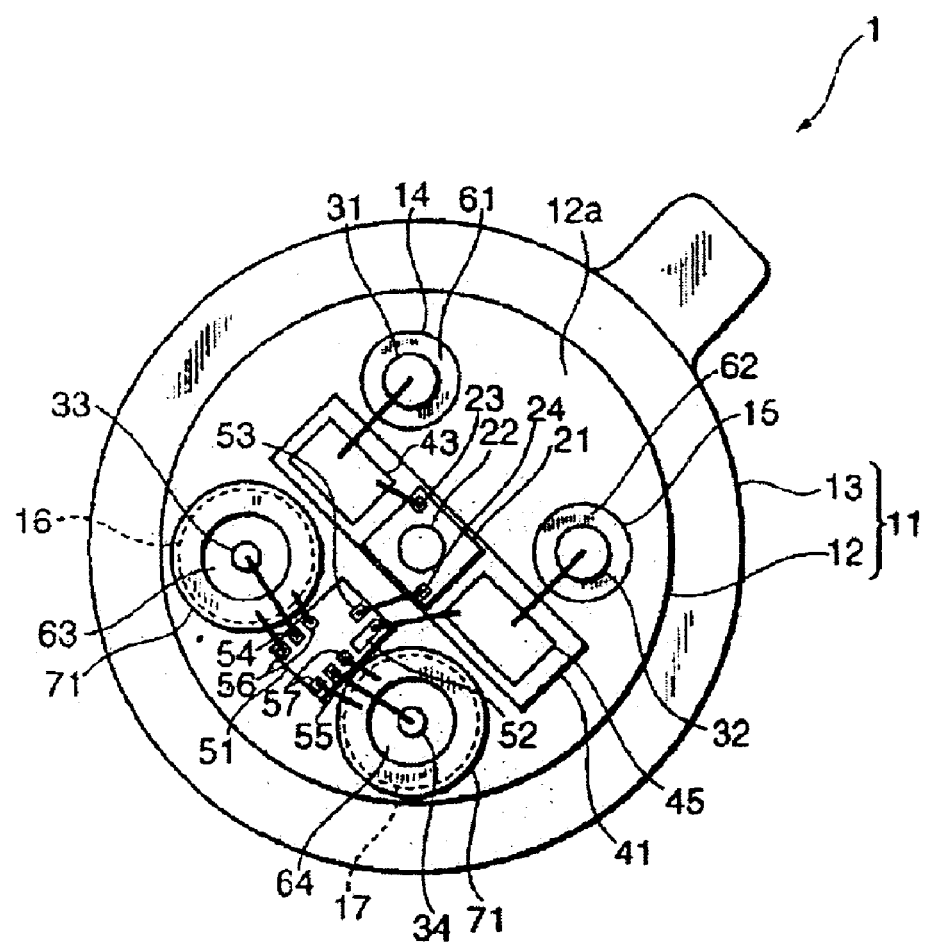
FIG. 3 is a plan view showing the second embodiment of the present invention.
Figure 4:
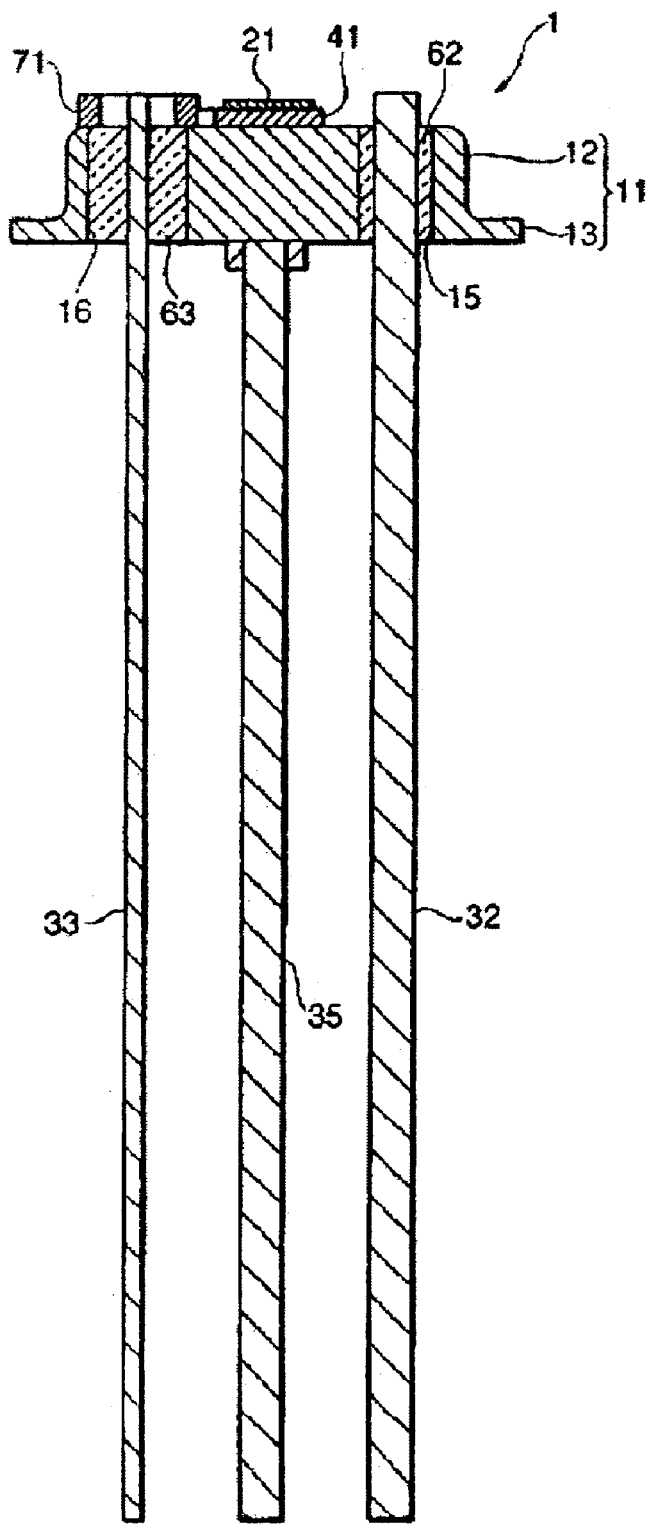
FIG. 4 is a cross-sectional view of the second embodiment.

Next, another aspect of the present invention will be described in the following. FIG. 3 is a plan view showing the second embodiment of the present invention, and FIG. 4 is a cross sectional view thereof. The second embodiment is different from the first embodiment in respect that the second embodiment has cylindrical members 71 around the second group of the lead terminals 33, 34.

The cylindrical member 71 is fixed and electrically connected to the base 11 so as to surround the protruding portion of the lead terminals 33, 34 from the mount surface 12a. Welding fixes the cylindrical member 71 to the base 11. A thickness and an inner diameter of the member 71 are about 0.35 mm and 0.75 mm, respectively. The member is made of metal, such as Kovar. The lead terminals 33, 34 are located on the center of the cylindrical member 71.

The semiconductor electronic device 51 has electrodes 56 at one side so as to sandwich the third electrode 54 therebetween. The electrodes 56 are connected and grounded to the cylindrical member 71, while the third electrode is connected to the lead terminal 33 located at the center of the bore of the member 71. On the other side of the device 51, other electrodes 57 connected to the other cylindrical member are provided so as to sandwich the fourth electrode 55. Since this configuration emulates a micro-strip line, the transmission impedance from the device 51 to the lead terminals 33, 34 can be approached to the line impedance. Moreover, since the cylindrical member 71 surrounds the protruding portion, the transmission impedance thereof can be also approached to the line impedance.

(Third Embodiment)

Figure 5:
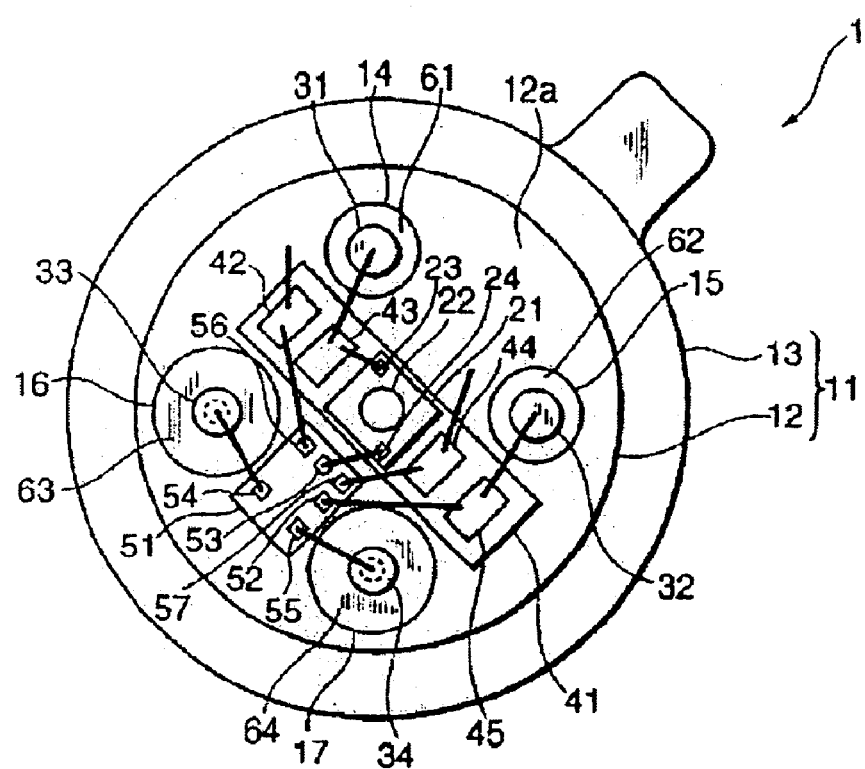
FIG. 5 is a plan view showing the third embodiment of the present invention.
Figure 6:
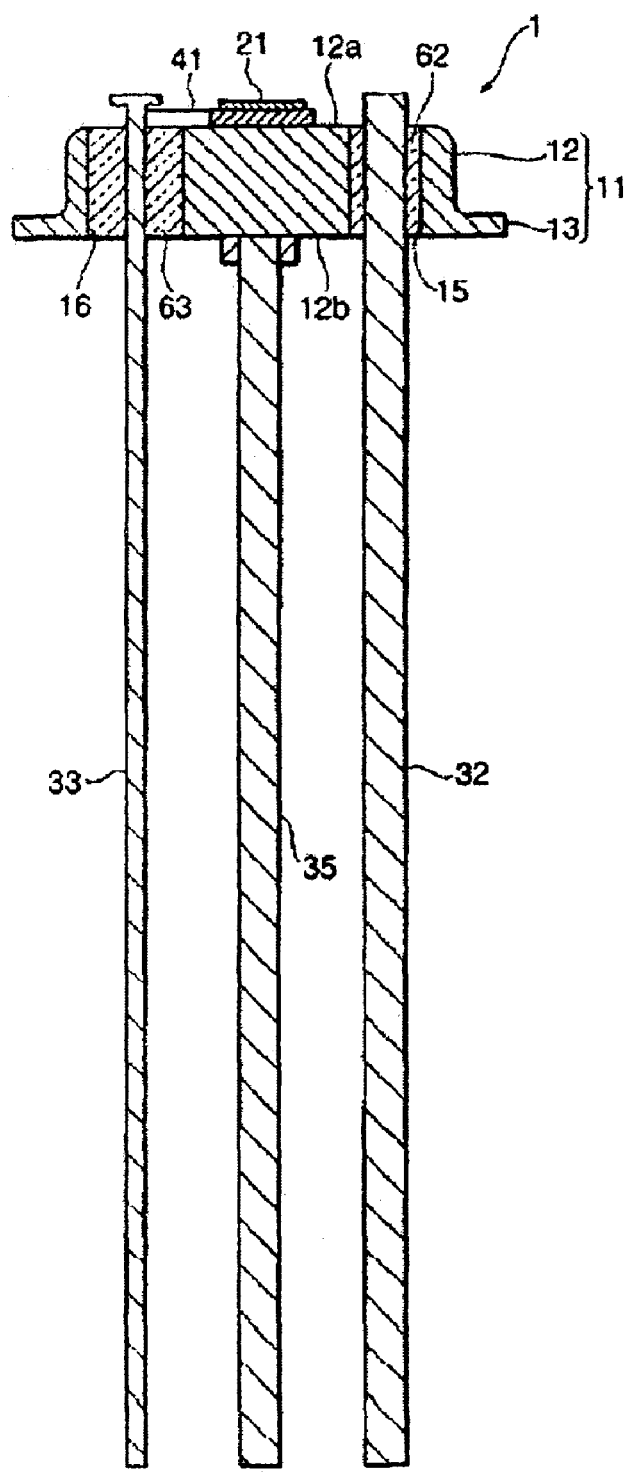
FIG. 6 is a cross-sectional view of the third embodiment.

FIG. 5 is a plan view showing the third embodiment of the present invention and FIG. 6 is a cross sectional view thereof. The third embodiment is different from the previous embodiments in respect of the shape of the tip of the lead terminal 33, 34. The tip of the lead terminals 33, 34 shape a nail-head, in which the diameter is greater as compared with that in the other portion. The former and the latter diameters are about 0.45 mm and about 0.2 mm, respectively.

Also in the third embodiment, the transmission impedance of the lead terminal 33, 34 can be controlled by adjusting the diameter of the through holes 16, 17 and that of the lead terminals. Further, the nail-headed portion of the lead terminals makes it easy to bond a wire thereto.

(Fourth Embodiment)

Figure 7:
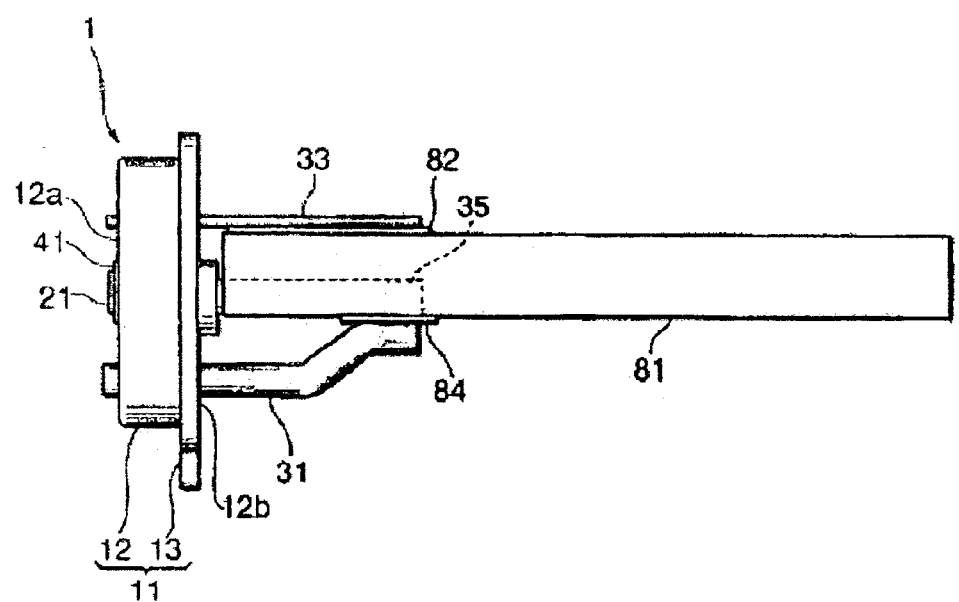
FIG. 7 is a side view showing the second aspect of the present invention.
Figure 8:
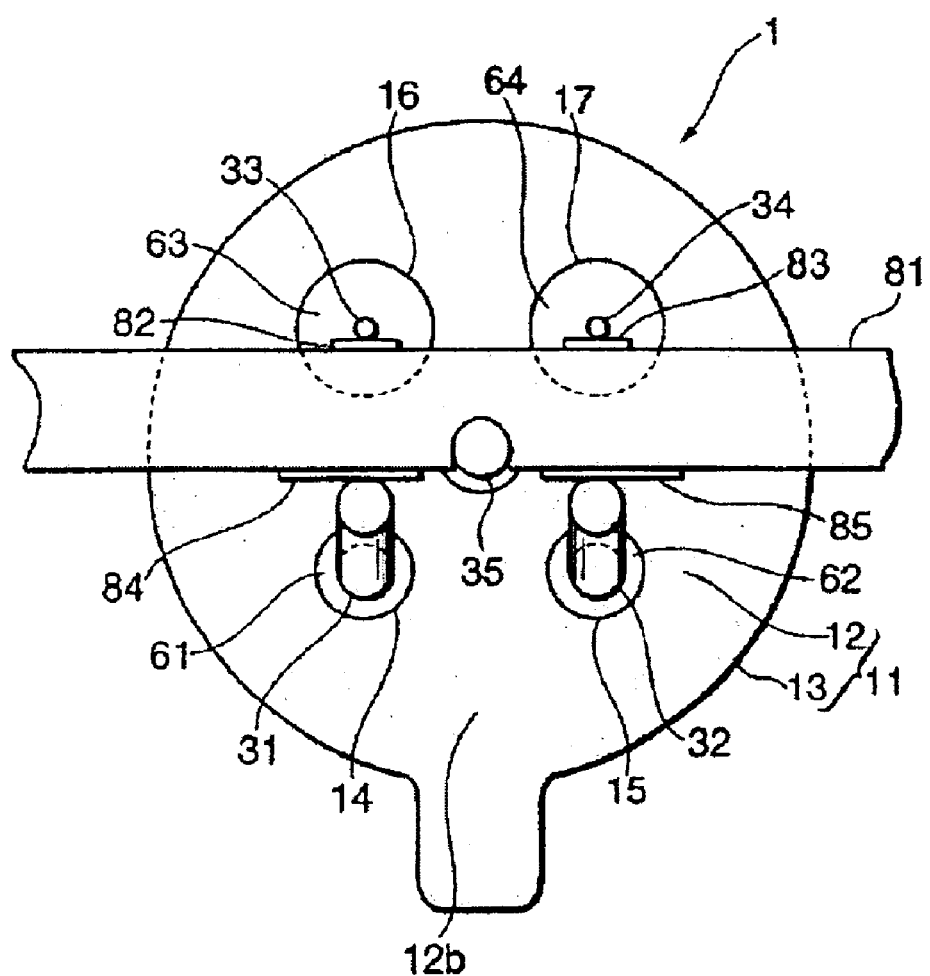
FIG. 8 is a plan view showing the second aspect of the present invention.
Figure 9:
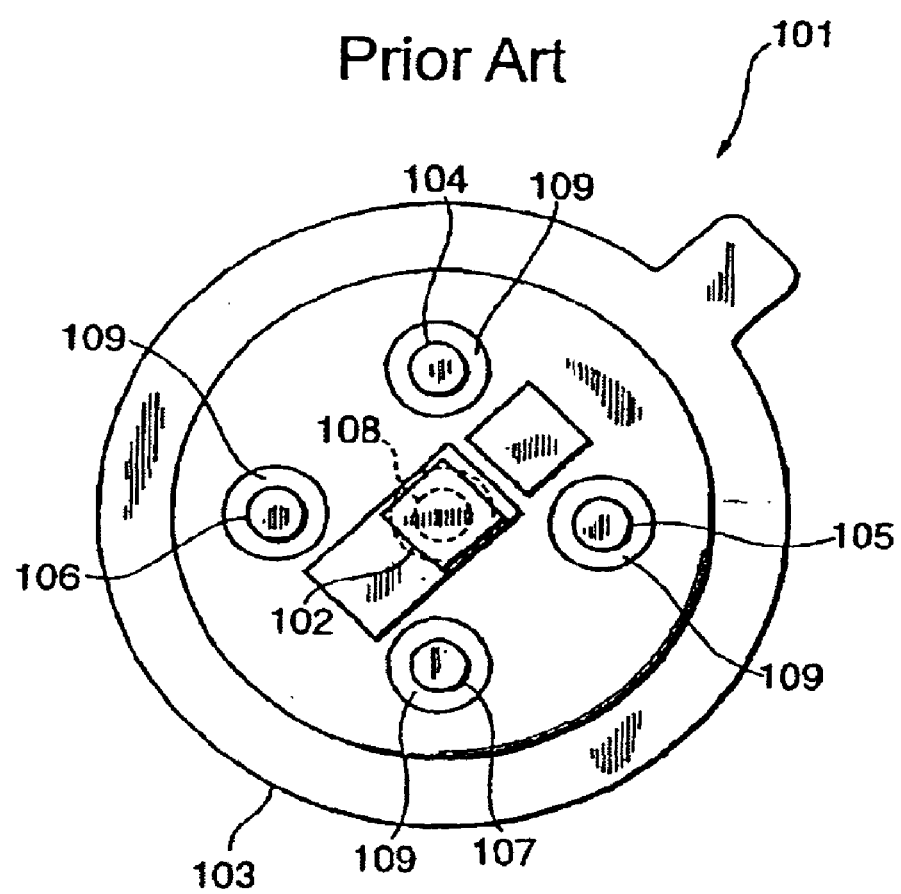
FIG. 9 is a plan view showing the conventional module.
Figure 10:
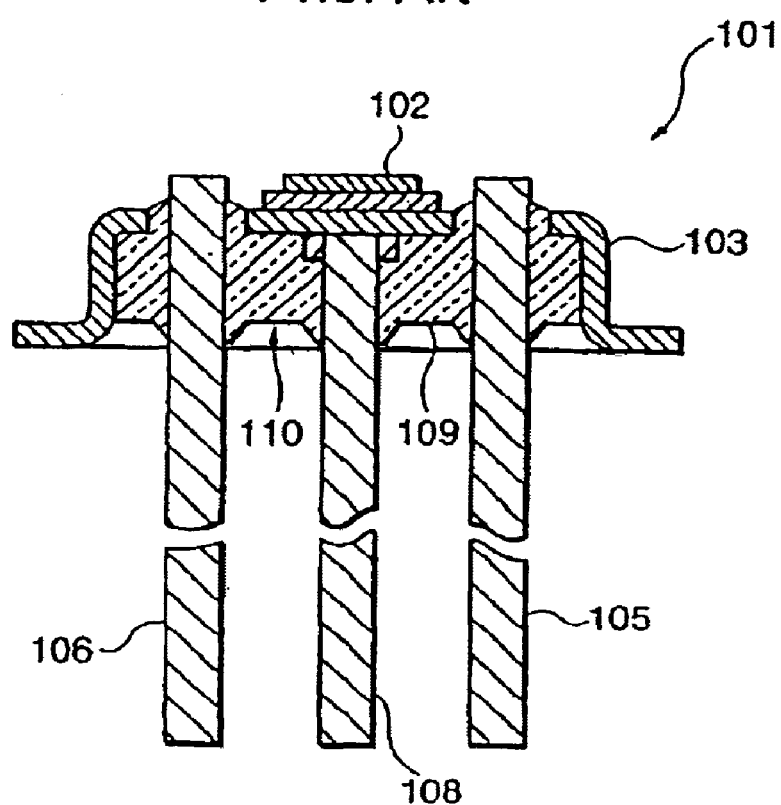
FIG. 10 is cross-sectional view of the conventional module.

The optical modules thus described are installed on a circuit board 81 as shown in FIG. 7 and FIG. 8. The Optical module 1 is positioned such that a virtual plane including the second group of the lead terminal 33, 34 which are signal lead terminals, is nearly parallel to one surface of the circuit board 81, wiring patterns 82, 83 are provided thereon. The optical module 1 is preferably close to the circuit board 81, and is allowed to contact the base 11 to the edge of the board 81. The signal lead terminals 33, 34 contact to the wiring pattern 82, 83 as the terminals are straitened. The lead terminal 35 is fixed to the other surface of the circuit board 81 as at least a portion of the terminal 35 is buried within the board 81. While the rest lead terminals 31, 32 are bent and contacted to the other wiring patterns 84, 85. The circuit board 81 is sandwiched by the signal lead terminals 33, 34, and the other lead terminals 31, 32, and 35.

By connecting the signal lead terminals 33, 34 to the wiring patterns 83, 84 as the terminals are straitened, a transmission loss during the signal propagates in the lead terminals can be restricted. The reason is that the wiring patters on the board 81 is impedance matched pattern, the portion of the holes of the module 1 is also impedance matched by the configuration as previously mentioned, and the module 1 is installed as close as possible to the circuit board. 81. Therefore, the length in which the impedance matching is not performed can be shortened.

From the invention thus described, it will be obvious that the invention and its application may be varied in many ways. For example, the diameters of the first and the second lead frame are illustrative and may by arranged. Such variations are not to be regarded as a departure from the spirit and scope of the invention, and all such modifications as would be obvious to one skilled in the art are intended for inclusion within the scope of the following claims.

What is claimed is:

1. A light-receiving module comprising:

a semiconductor light-receiving device for converting an optical signal to an electrical signal;

a first lead terminal for outputting the electrical signal converted by the semiconductor light-receiving device, the first lead terminal having a first diameter;

a second lead terminal for providing an power supply to the semiconductor light-receiving device, the second lead terminal having a second diameter greater than the first diameter; and a metal body for installing the semiconductor light-receiving device thereon, the metal body having a plurality of through holes having an inner surface for passing the first lead terminal and the second lead terminal, wherein the light-receiving module is sealed by filling up a sealant only in an opening between the first lead terminal and the inner surface of the through hole and between the second terminal and the inner surface of the through hole.

2. The light-receiving module according to claim 1, further includes a cylindrical member provided on the metal body, a portion of the first lead terminal protruding from the metal body being surrounded with the cylindrical member.

3. The light-receiving module according to claim 1, wherein the first lead terminal has a tip portion protruding from the metal body, the tip portion having a diameter greater than the first diameter.

4. The light-receiving module according to claim 1, wherein the first lead terminal is impedance matched at the through hole through which the first lead terminal passes.

* * * * *